US010666092B2

(12) United States Patent
Hyland et al.

(10) Patent No.: US 10,666,092 B2
(45) Date of Patent: May 26, 2020

(54) SYSTEM AND METHOD FOR COLLECTION AND DISTRIBUTION OF SPACE BASED SOLAR POWER

(71) Applicants: David C. Hyland, College Station, TX (US); Haithem A. Altwaijry, Riyadh (SA)

(72) Inventors: David C. Hyland, College Station, TX (US); Haithem A. Altwaijry, Riyadh (SA)

( * ) Notice: Subject to any disclaimer, the term of this patent is extended or adjusted under 35 U.S.C. 154(b) by 285 days.

(21) Appl. No.: 15/328,367

(22) PCT Filed: Jul. 23, 2015

(86) PCT No.: PCT/US2015/041854
§ 371 (c)(1),
(2) Date: Jan. 23, 2017

(87) PCT Pub. No.: WO2016/014869
PCT Pub. Date: Jan. 28, 2016

(65) Prior Publication Data
US 2017/0214247 A1    Jul. 27, 2017

Related U.S. Application Data

(60) Provisional application No. 62/148,570, filed on Apr. 16, 2015, provisional application No. 62/028,000, filed on Jul. 23, 2014.

(51) Int. Cl.
| | | |
|---|---|---|
| *H02J 50/20* | (2016.01) | |
| *H01L 31/041* | (2014.01) | |
| *H01L 31/0392* | (2006.01) | |
| *H02S 20/00* | (2014.01) | |
| *B64G 1/42* | (2006.01) | |
| *H02J 50/23* | (2016.01) | |
| *B64G 1/44* | (2006.01) | |
| *H02J 3/38* | (2006.01) | |

(Continued)

(52) U.S. Cl.
CPC .............. *H02J 50/20* (2016.02); *B64G 1/428* (2013.01); *B64G 1/443* (2013.01);
(Continued)

(58) Field of Classification Search
CPC . H02J 50/20; H02J 50/23; H02J 50/27; H01L 31/04–078
See application file for complete search history.

(56) References Cited

U.S. PATENT DOCUMENTS

2009/0315412 A1* 12/2009 Yamamoto ............. B64G 1/428
307/149
2010/0289342 A1* 11/2010 Maness .................. H02J 17/00
307/104

(Continued)

FOREIGN PATENT DOCUMENTS

CN        103236804 A  *  8/2013

OTHER PUBLICATIONS

K. Reed, H.J. Willenberg, "Early commercial demonstration of space solar power using ultra-lightweight arrays", May 2, 2009, Acta Astronautica, vol. 65, Issues 9-10.*

(Continued)

*Primary Examiner* — Pinping Sun
*Assistant Examiner* — David A Shiao
(74) *Attorney, Agent, or Firm* — Arthur M. Dula.; Law Office of Art Dula.

(57) ABSTRACT

A solar power transmission system having a solar-microwave fabric for absorbing sunlight, transforming the sunlight into electrical energy, amplifying a received signal using the electrical energy, and transmitting the amplified signal to a rectenna beacon. Embodiments according to the present invention include a system for space-based solar power transmission having a solar power collection balloon in geostationary orbit around Earth, which allows for continuous, feasible, and efficient collection of solar power in space that can be packaged into a condensed canister for launch and deployed without manual or machine assembly once in orbit.

8 Claims, 7 Drawing Sheets

(51) Int. Cl.
  *H01L 51/42* (2006.01)
  *H01L 51/00* (2006.01)
  *B64G 1/22* (2006.01)
  *B64G 1/10* (2006.01)

(52) U.S. Cl.
  CPC .. *H01L 31/03926* (2013.01); *H01L 31/03928* (2013.01); *H01L 31/041* (2014.12); *H02J 3/383* (2013.01); *H02J 50/23* (2016.02); *H02S 20/00* (2013.01); *B64G 1/10* (2013.01); *B64G 2001/224* (2013.01); *H01L 51/0097* (2013.01); *H01L 51/42* (2013.01); *Y02E 10/541* (2013.01)

(56) References Cited

U.S. PATENT DOCUMENTS

| | | | | |
|---|---|---|---|---|
| 2011/0080135 A1* | 4/2011 | Bland | ............ | H02J 17/00 |
| | | | | 320/101 |
| 2011/0290296 A1* | 12/2011 | Daniel | ............ | H01L 31/042 |
| | | | | 136/244 |
| 2012/0153744 A1* | 6/2012 | Criswell | ............ | B64G 1/428 |
| | | | | 307/104 |

OTHER PUBLICATIONS

N. Kaya, "Development and Demonstration of New Retrodirective Antenna System for Solar Power Satellite of Sandwich Structure", Dec. 2000, ISAP2000 Fukuoka Japan.*

T.W. Turpin, R. Baktur, "Meshed Patch Antennas Integrated on Solar Cells", Jun. 16, 2009, IEEE Antennas and Wireless Propagation Letters, vol. 8.*

D.P. Cadogan, J.K. Lin, "Inflatable solar array technology", Jan. 14, 1999, 37th AIAA Aerospace Sciences Meeting and Exhibit.*

S. Vaccaro, P. Torres, J.R. Mosig, A. Shah, J.-F. Zurcher, A.K. Skrivervik, F. Gardiol, P. de Maagt, L. Gerlach, "Integrated solar panel antennas", Mar. 2, 2000, Electronics Letters, vol. 36, Issue 5.*

English machine translation of CN103236804A, published Aug. 7, 2013.*

* cited by examiner

SYSTEM AND METHOD FOR COLLECTION AND DISTRIBUTION OF SPACE BASED SOLAR POWER

CROSS-REFERENCE TO RELATED APPLICATIONS

The present application claims the benefit of PCT Application no. 2015041854 filed on, Jul. 23, 2015, provisional applications Nos. 62/028,000 filed Jul. 23, 2014 and 62/148,570 filed Apr. 16, 2015, which are incorporated herein by reference.

FIELD OF THE INVENTION

The present invention generally relates to solar powered electrical energy generation and transmission and in particular, a system and method for generating electrical energy from photovoltaic cells dispersed on a spherical apparatus located in space and transmitting the energy to a distribution node.

BACKGROUND INFORMATION

Solar power is the collection and conversion of sunlight into electrical energy often using photovoltaic cells. Because there is no burning of fossil fuels during the capturing of sunlight, it is considered a "green" or renewable energy source. Because of concerns related to the strong relationship between burning fossil fuels and greenhouse gases, solar power technologies and installations have grown. The International Energy Agency has forecasted that by 2050, solar power could supply 27% of the world's electricity needs. Current methods of collecting solar power include the development of solar energy generating system (SEGS) or solar farms. Generally these systems require high capital costs, especially in the form of land and maintenance, prohibiting the growth and development of solar power as a primary energy source. Additionally, solar power is considered a less efficient energy source compared to coal and nuclear energy because it is an intermittent energy source as power cannot be generated at night.

Space-based solar power is the concept of harnessing solar power in space for use on Earth. Unlike current collection methods where the means for collecting solar energy reside on Earth, space-based solar power allows for the capturing of solar energy in space. By transitioning the point of collection to space, solar power can be captured more efficiently. The advantages of space-based solar power are twofold; a higher collection rate and a longer collection period. Because there is no atmosphere in lower Earth orbit to diffuse the energy transmitted by the sun, space-based solar power is more efficient than current solar power capturing methods. Additionally, the collection means in space-based solar power can constantly face the sun (i.e. no night) thereby overcoming the issue of intermittent generation.

Prior space-based solar power design concepts have relied on large, articulated structures that must be assembled in space requiring many launches of the component parts into orbit. These characteristics necessitate very large initial investments and technology developments to field an operational system. An example of such a system is the Naval Research Lab's 5 MW SSP design, which is comprised of two 18,300 square meter solar arrays and a one kilometer diameter microwave antenna. The SSP design merely generates 5 megawatts of energy and is estimated to be only 10% efficient. Further, it requires relay mirror to rotationally move in order to direct energy into the solar arrays thereby using some of the energy it captures. Lastly, the SSP design needs to be launched by multiple vehicles and assembled in orbit. For these reasons, the SSP design is considered cost prohibitive and inefficient.

Another example of prior designs is the Solar Power Satellite via Arbitrarily Large Phased Array (SPS-ALPHA). The SPS-ALPHA design is also a very large structure and requires thousands of mirrors to be rotated in order to redirect reflected sunlight onto a solar array. Like the SSP design, the SPS-ALPHA would require several launches in order to get all of the components to space where it would have to be assembled. Though the SPS-ALPHA overcomes several of the issues found in the SSP design, it is also considered to be cost prohibitive and inefficient.

SUMMARY

In accordance with one aspect of the present invention, the spherical fabric balloon comprising printed photovoltaic cells and transmitters captures solar power and communicates it to ground collection stations on Earth using radiation. The fabric used for the balloon is thin and flexible requiring no moving parts or mechanical motion. Unlike prior designs, the balloon is merely one (1) kilometer in diameter and requires no orbital manufacturing or construction. Using adaptive phased array technologies to yield a transmission of radiation receivable by low-amplitude beacons that are transferred into electrical energy, the present invention makes space-based solar power feasible. Thus, embodiments according to the present inventions are expected to gather solar power from any angle of the sun and therefore can continuously and efficiently generate energy and transmit it in the form of microwave radiation even at night. The present invention is also expected to be capable of being packed for launch in existing heavy-lift vehicles and requires no manual or robotic assembly once in geostationary orbit.

BRIEF DESCRIPTION OF THE DRAWINGS

These and other features and advantages of the present invention will be better understood by reading the following Detailed Description, taken together with the Drawings wherein.

DETAILED DESCRIPTION OF THE PREFERRED EMBODIMENTS

Power Star™ System

Figure 1:
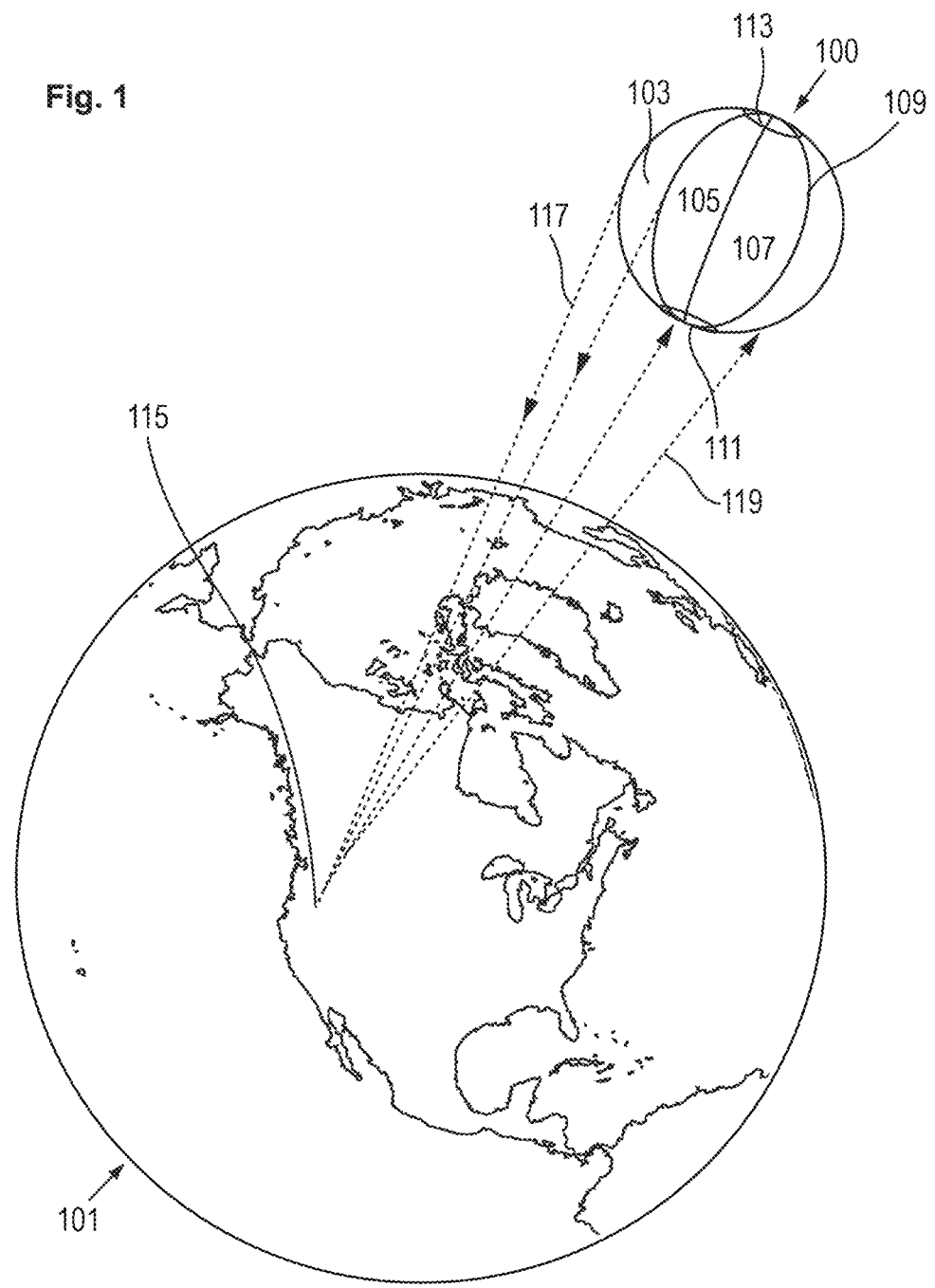
FIG. 1 is a laterally elevated view of one embodiment of the present invention.

The embodiment of FIG. 1 provides solar power collection balloon 100, which is inflated in geostationary altitude above the Earth 101. In this embodiment solar power collection balloon 100 has a spherical shape that is assembled by connecting several gores 103, 105, 107 of solar microwave fabric 200 with rounded sides 109 and pointed ends 111. Polar caps 113 are placed over the pointed ends 111. At least one rectenna beacon 115 is erected on Earth 101 to receive a power transmission 117 and transmit a beacon radiation 119. In this embodiment, the solar power collection balloon 100 is comprised of solar-microwave fabric 200.

Solar-Microwave Fabric 200

Figure 2:
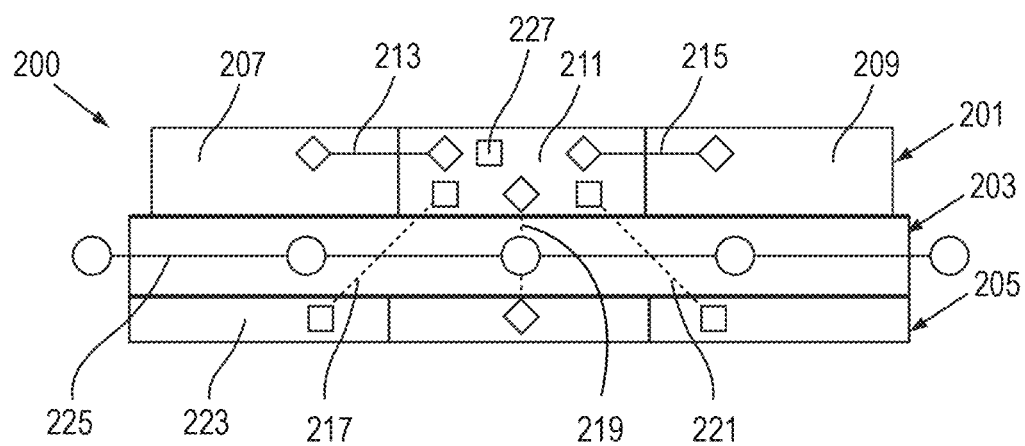
FIG. 2 is a cross-sectional view of an embodiment of the present invention.

FIG. 2 shows a cross-section of an embodiment of the solar-microwave fabric 200. In this embodiment, the solar-microwave fabric 200 has an exterior surface layer 201, a substrate layer 203, and an inner surface layer 205. Photovoltaic cells 207 and 209 are printed on the exterior surface layer '201 of the solar-microwave fabric 200. The photovoltaic cells 207 and 209 may be polymer cells using long chains of molecules to generate electricity, dye sensitized solar cells, copper indium gallium selenide cells, or cadmium telluride solar cells.

Similarly, microwave transmitters 211 are printed on the exterior surface of the solar-microwave fabric 200. In this embodiment the microwave transmitters 211 are placed in a way so as to not overlap the photovoltaic cells 207 and 209. These microwave transmitters 211 can be printed microwave patch antennas. Microwave patch antennas comprise a metal patch mounted on a grounded, dielectric substrate. The dielectric substrate provides a resonant cavity to amplify a signal. These microwave transmitters 211 may be printed in a geometrically regular arrangement which would produce an aperture point spread function having a central lobe in a main concentrated spot and several grating lobes in regularly spaced offset spots. This is not an ideal arrangement because the grating lobes have a negative effect on the accuracy with which a desired power distribution may be approximated as the actual produced distribution is the convolution of the desired distribution and the point spread function. Therefore, the placement of the microwave transmitters 211 on the fabric is somewhat randomized so long as it does not overlap the photovoltaic cells 207 and 209. The randomization allows for the dispersal of grating lobes so that a central lobe remains the only power concentration in the emitted radiation. Power connectors 213 and 215 are attached to these photovoltaic cells 207 and 209 linking the cells to at least one microwave transmitter 211. Power connectors 217, 219, 221 connect the microwave transmitters 211 through the thickness of the substrate layer 203 to transceivers 223 in the inner surface layer 205. Each microwave transmitter 211 is powered either by the adjacent photovoltaic cells 207 and 209 or by transceivers 223 on the inner surface layer 205. The transceivers 223 operate at a high frequency and are oriented so that the resonant axes of each diametrically opposite pair are parallel. The substrate layer 203 houses a copper grid 225 for electrical ground and rigidification. Each microwave transmitter 211 is equipped with an analog circuit 227.

Figure 3:
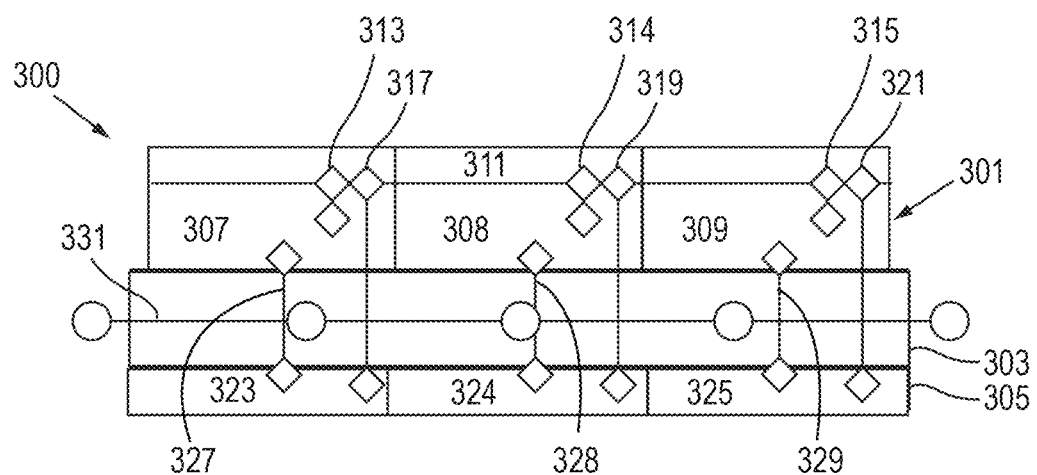
FIG. 3 is a cross-sectional view of an alternate embodiment of the present invention.

In an alternative embodiment shown in FIG. 3, optically transparent microwave patch antennas 311 are printed directly on photovoltaic cells 307, 308, and 309 so the total area of the solar-microwave fabric collects solar energy. These optically transparent microwave patch antennas may be printed in a mesh design. As in FIG. 2, the solar-microwave fabric of this embodiment 300 has an exterior surface layer 301, a substrate layer 303, and an inner surface layer the solar-microwave fabric 300. In this embodiment, the photovoltaic cells 307, 308, and 309 305. Photovoltaic cells 307, 308, and 309 are printed on the exterior surface layer 301 of may be printed in an array all next to each other. Power connectors 313, 314 and 315 are attached to these photovoltaic cells 307, 308 and 309 linking the cells to the optically transparent microwave patch antennas 311. Power connectors 317, 319, 321 connect the optically transparent microwave patch antennas 311 through the thickness of the substrate layer 303 to transceivers 323, 324, and 325 in the inner surface layer 305. The optically transparent microwave patch antennas 311 are powered either by the adjacent photovoltaic cells 307, 308, and 309 or by transceivers 323, 324, and 325 on the inner surface layer 305. The transceivers 323, 324, and 325 are connected to the photovoltaic cells 307, 308 and 309 by power connectors 327, 328, and 329. The substrate layer 303 houses a copper grid 331.

Turning back to FIG. 2, the substrate layer 203 of the solar-microwave fabric 200 may be any material that can allow for printing of photovoltaic cells 207 and 209 and microwave transmitters 211 and can withstand the wide range of temperatures necessary for the functioning of the invention as well as having the adequate tear resistance and minimum density. Such materials include Mylar or Kapton. Mylar can withstand temperatures ranging from −70 degrees Celsius to 150 degrees Celsius while Kapton can functions at temperatures between 269 to 400 degrees Celsius. The volumetric density of kapton at 1420 kg/m$^3$ is slightly more than mylar at 1390 kg/m$^3$.

The solar-microwave fabric is not limited in application to the solar power collection balloon. The fabric can be used in several applications in space or on Earth. The solar-microwave fabric can also cover any three-dimensional shape and is not limited to covering a sphere or be sewn and inflated into a spherical shape as in the solar power collection balloon. The solar-power microwave fabric may even be laid flat on the Earth's surface to generate solar power and transmit it to a beacon that is placed within transmission range of the microwave transmitters.

Methodology

Figure 4:
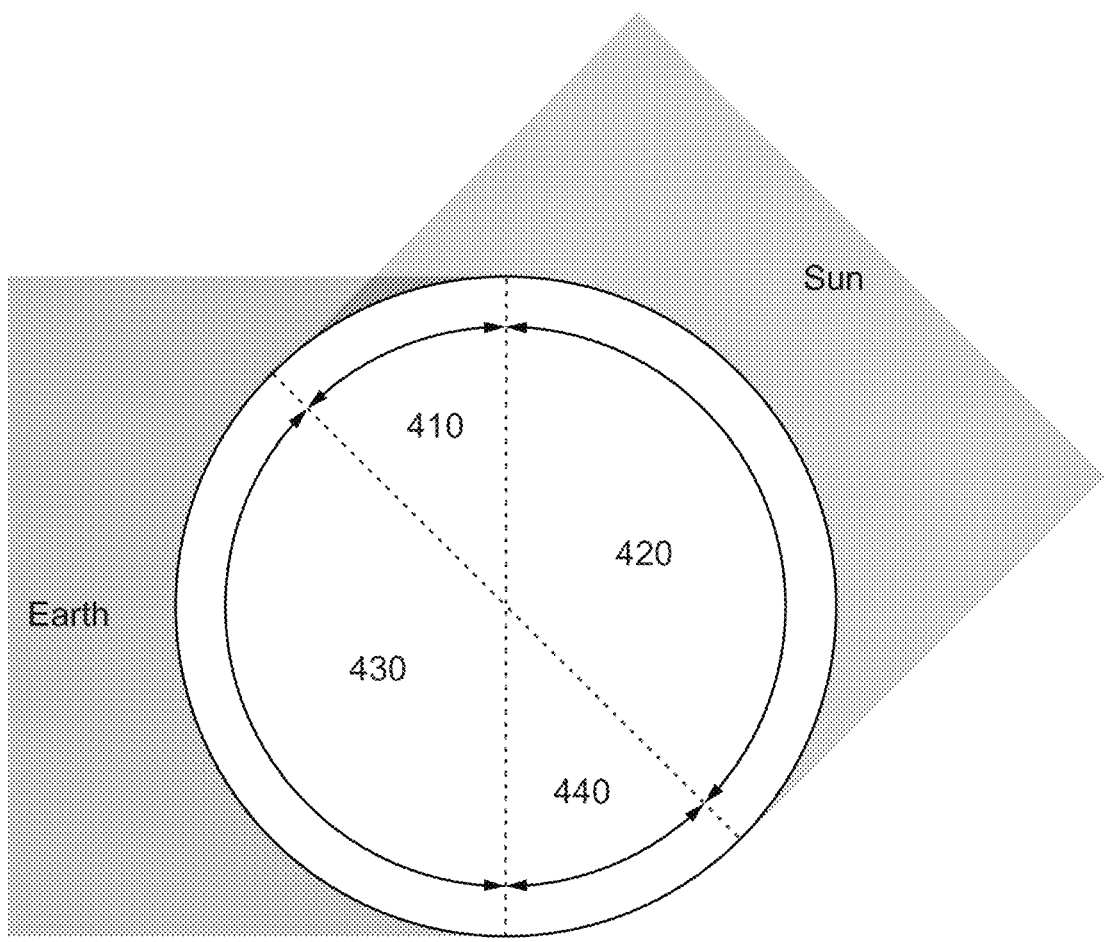
FIG. 4 is a lateral view of an embodiment of the present invention.

Given that the directions of the sun and the beacons are not coincident, the surface of the solar power collection balloon is divided into four sectors as shown in FIG. 4: 1.) a sector exposed to both sunlight and beacon radiation 410; 2.) a sector exposed to sunlight but no beacon radiation 420; 3.) a sector receiving beacon radiation but no sunlight 430; and 4.) a sector where neither sunlight nor beacon radiation are received 440. The microwave transmitters within sector 1.) 410 draw power from the adjacent photovoltaic cells. The microwave transmitters in sector 3.) 430 that need to be active because they can receive a beacon signal are powered by either the nearby photovoltaic cells or by the connected transceivers; whichever is producing more power. In sectors 2.) 420 and 4.) 440 the microwave transmitters are blocked or not functioning as intended because there is no beacon signal. Therefore, the microwave transmitters need not draw power and are inactive.

Figure 5:
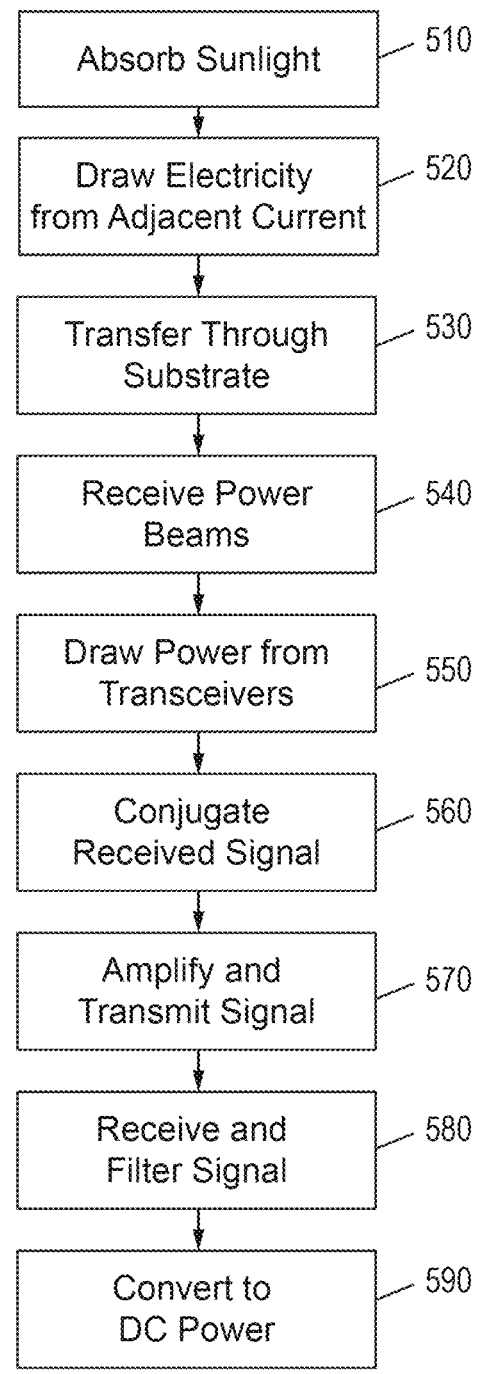
FIG. 5 is a flow chart of the methodology of an embodiment of the present invention.

The solar power collection balloon functions as a series of steps with each sections 1.)-4.) having a different purpose that operates synchronistically to transfer microwave radiation to rectenna beacons. The steps for how power is generated and transferred to the rectenna beacons are shown in FIG. 5. The photovoltaic cells absorb sunlight or solar energy and convert it directly into electricity 510. The microwave transmitters within sector 1.) draw the electricity generated from the adjacent photovoltaic cells 520 using the power connectors that link the microwave transmitters to nearby photovoltaic cells. At 530 electricity generated by the photovoltaic cells in sector 2.) is transferred through the substrate to immediately proximate internal surface layer transceivers. This transfer is done via the power connectors that indirectly or directly link the photovoltaic cells to the transceivers. The transceivers in sector 2.) emit electrical power beams through the center of the sphere towards sector 3.) at 540 so that the electrical power beams can be received by the transceivers in sector 3.). At 550, microwave transmitters in sector 3.) draw the received electrical power through the thickness of the substrate layer from the proximate transceivers in the inner surface layer. This drawing of power is performed via the power connectors that directly link the transceivers to the microwave transmitters. Each transmitter receives just a few watts so there are no high voltages or large wires. This localized architecture means robustness against partial damage.

Each microwave transmitter is equipped with a retro-directive circuit that conjugates the phase of the beacon signal that it receives 560 from the rectenna beacon, then amplifies the signal and re-transmits it 570. Thus the microwave transmitter, with its retro-directive circuit, emits an amplified signal proportional to the beacon radiation received by any one patch antenna. The solar-microwave fabric of the solar power collection balloon directs a concentrated signal at the rectenna beacon without a priori knowledge of the rectenna beacon's location or the surface geometry of the solar-microwave fabric. One way to accomplish the phase conjugation of the rectenna beacon signal at each individual transmitter is the hetrodyne technique. The hetrodyne technique achieves phase conjugation with only analog hardware, relatively simple circuitry, no digital processing, and lots of resistance to the space radiation environment. Using this technique, the transmitter is connected to a mixer that is pumped with a local oscillator signal that has double the frequency of the beacon signal. The hetrodyne technique therefore allows for no digital processing and resistance to the space radiation environment. The frequency of the resulting signal is so large compared to the beacon signal frequency that it can be readily filtered and suppressed when received by the rectenna beacon at 580. The rectenna beacon filters the resulting signal and converts the microwave signal to DC power at 590. At the location of each rectenna, a low-power microwave beacon is placed. Another signal that must be suppressed is the beacon signal that leaks directly into the output of the phase conjugator. In one embodiment of the invention balanced mixer topologies can be used to eliminate this leakage signal.

Let: $V_B \cos(\omega_B t + \theta_B)$=the beacon radiation received by any one patch antenna $V_{LO} \cos(\omega_{LO} t)$=the local oscillator signal Then, $V_M$=the mixing product $$V_M = V_B \cos(\omega_B t + \theta_B) V_{LO} \cos(\omega_{LO} t)$$

$$= \frac{1}{2} V_B V_{LO} [\cos((\omega_{LO} - \omega_B)t - \theta_B) + \cos((\omega_{LO} + \omega_B)t + \theta_B)]$$

If the local oscillator frequency is twice the beacon frequency, $\omega_{LO} = 2\omega_B$, and therefore $$V_M = \frac{1}{2} V_B V_{LO} [\cos(\omega_B t - \theta_B) + \cos(3\omega_B t + \theta_B)]$$

The patch antenna elements of the phased array can be equally spaced or arbitrarily located or on a different layer of the solar-microwave fabric. By changing the local oscillator frequency, the re-radiated signal can be frequency modulated. In an alternative embodiment of the invention, a single microwave transmitter transmits a signal to all other microwave transmitters. The other microwave transmitters have a local oscillator embedded in an analog phase-locked loop that uses this signal as a reference signal. The reference signal is fed to a phase detector comprised of an analog multiplier and filter. The low-pass filtered output is input to a voltage-controlled oscillator. The output from the voltage-controlled oscillator is, in turn, fed back in a negative feedback loop to the phase detector with some gain.

Let $2\omega_B$=the signal of a single transmitter sent to all other transmitters.

$L_k$ = reference signal from the synchronizing microwave transmitter

= $V_{ref}(2\omega_n t + \varphi_{ref})$

The reference signal from the synchronizing microwave transmitter may be fed into a phase detector consisting of an analog multiplier and filter. The low-pass filtered output is input to a voltage controlled oscillator, and its output is, in turn, fed back in a negative feedback loop to the phase detector with some gain. The dynamics of all N analog phase-locked loop is characterized by:

Let $\varphi_k$=is the phase of the $k^{th}$ microwave transmitter

Let $\tau$=a time constant

Let $g_v$=the sensitivity of the voltage controlled oscillator $\varphi''_k + (1/\tau)\varphi'_k + \gamma \sin(\varphi_k - \varphi_{ref}) = 0$=the motion of a damped pendulum k=1, ..., N $\gamma_{ink} = (g_v C/2\tau) V_{ref} V_{LOk} > 0$ Thus the phases of all microwave transmitter local oscillators asymptotically approach the reference phase.

Reliance on a single transmitter to synchronize all of the local oscillators might bear the risk of a single point of failure. Accordingly, in another embodiment of the invention, building in synchronization into each transmitter circuit and not having a special reference unit is preferred. In this embodiment, cross-talk is provided at a specific frequency such as $2\omega_B$ and the cross-talk becomes the reference signal for the analog phase-locked loop. In yet another embodiment of the invention, the local oscillator is replaced by the analog phase-locked loop. The output of the analog phase-locked loop is input to a bandpass filter centered at frequency $2\omega_B$. The low amplitude filter output is then added to the phase conjugated signal at frequency $2\omega_B$, which is broadcast by the microwave transmitter. The slight cross-talk that is inevitable for the patch antenna results in neighboring antennae receiving the leaked $2\omega_B$ signal. Likewise, due to cross-talk, antenna k receives the $2\omega_B$ signals broadcast by other patch antennas. This received signal is passed through a bandpass filter centered at frequency so as to suppress all other frequency content, the output of which serves as the reference signal, $L_k$, for the analog phase-locked loop. When several microwave transmitters are placed near to one another, withing a short time their local oscillators will all synchronize. Thus, the phase conjugated signals will be locked to a common time reference.

The cross-talk signal coming into the transmitter k from neighboring transmitters has the form:

$L_k = \Sigma \beta_{mk} V_{LOm} \cos(2\omega_B t + \varphi_m)$ where the limit starts at m=1, ..., N and m≠k $\beta_{mk} = \beta_{mk}$, real and positive $\forall k$, m=1, ..., N Then, extending the analysis of the analog phase-locked loop, the dynamics of the phases, $\varphi_k$, k=1, ..., N is described by:

$$\varphi''_k + (1/\tau)\varphi'_k + \Sigma \gamma_{mk} \sin(\varphi_k - \varphi_m) = 0$$

$$\gamma_{mk} = \gamma_{km} > 0$$

These are the equations of N, coupled pendula. It is easy to show that all of the phases converge to the same value. In other words, when several transmitters are placed near one another, within a short time their local oscillators will all synchronize. Thus by means of this highly decentralized mechanism, the phase conjugated signals will be locked to a common time reference.

In an alternative embodiment of the invention, the microwave transmitter has a microprocessor that records the beacon radiation received from the rectenna beacon, records the radiation wave form, and concurrently emits a return signal in reverse time. In this embodiment, radiation commences with a widening interference pattern, then each microwave transmitter on the circumference of the sphere records the time signal of the field amplitude measured at its location, and transmits a signal recorded in reverse time. The resulting transmitted signal sent to the rectenna beacons has concentrated spots of intensity centered at the rectenna beacon locations. These spots represent point spread function distributions and are broader than the beacons. The broader width of the ground plane spots is mainly proportional to the overall size of the solar power collection balloon. Despite the usual assumption that phased arrays are planar, the accuracy with which a desired ground distribution is duplicated is mostly dependent on size, not on shape.

Deployment

Figure 6:
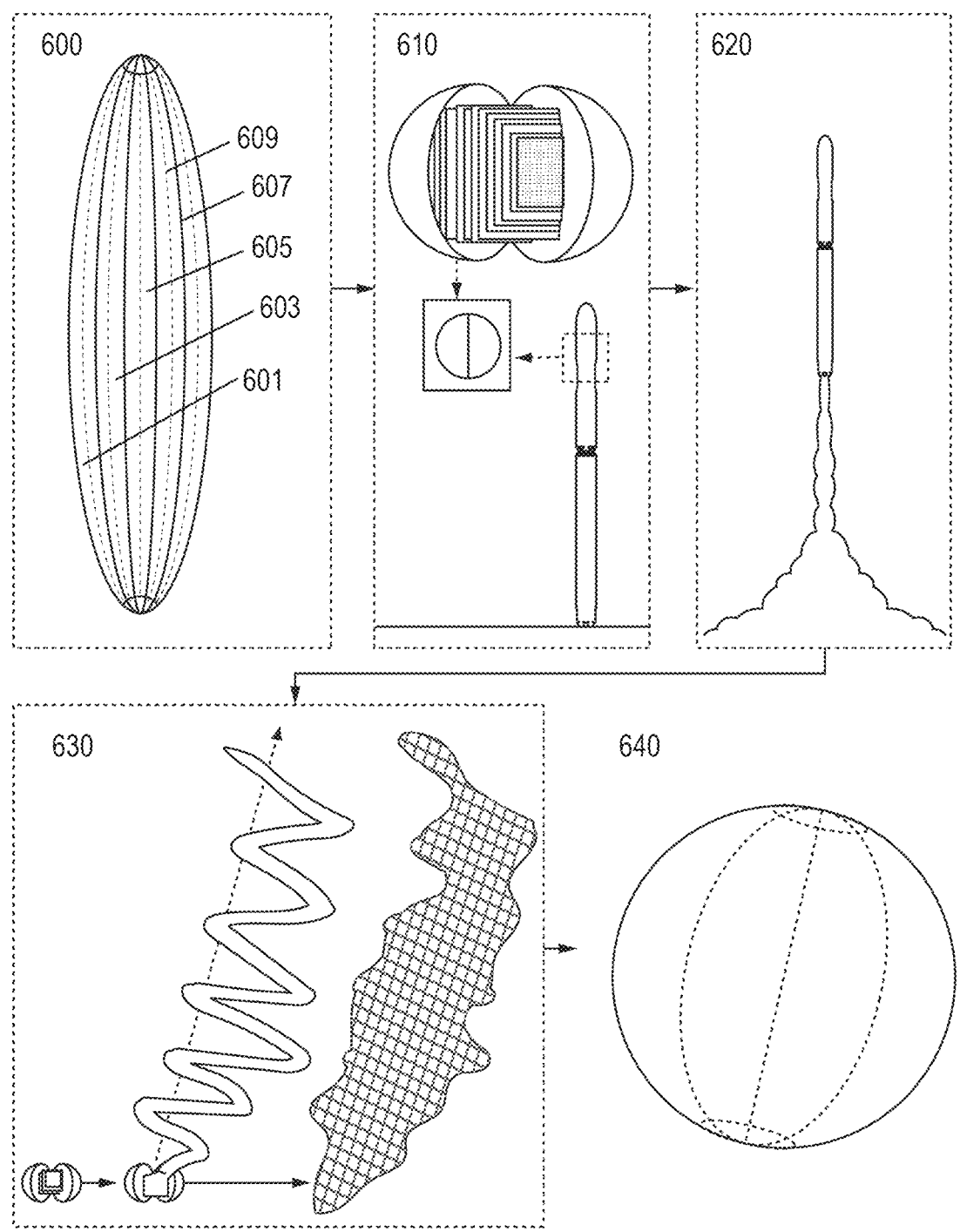
FIG. 6 is an elevated lateral partial view of a further alternate embodiment of the present invention.

In one embodiment of the invention the solar power collection balloon is deployed and inflated which in geostationary orbit. To understand better how the solar power collection balloon is deployed it is necessary to examine how it is packaged. In one embodiment of the invention shown in FIG. 6, each individual gore 601, 603, and 605 is pleated and folded to have one straight edge 607 and one curved edge 609 using pleating techniques during step 600. Once pleated and initial folding of the gores is complete, the entire balloon is folded into a canister at step 610 that can easily fit into launch vehicle payload fairings. This payload will then be launched on a rocket shown at step 620.

Once in geostationary orbit, the canister is opened and the solar power collection balloon is inflated using any one of commonly known techniques such as sublimating powder as in step 630. In one embodiment, the sublimating powder may coat the entire interior surface of the sphere and in another, the sublimating powder may be encapsulated in pockets connected to the interior surface of the solar power collection balloon. Two known sublimating powders that may be used to inflate the solar power collection balloon are anthraquinone and/or benzoic acid. In another embodiment of the invention, the solar power collection balloon is inflated using gas pressure until the solar power collection balloon surface reaches a rigidity point. Upon reaching this rigidity point, a valve disposed in the solar power collection balloon or a patch of the solar power collection balloon opens to expose the interior and releases the gas pressure. Once inflated, the solar power collection balloon is able to collect solar energy and transmit it to rectenna beacons as shown in step 640.

When the solar power collection balloon is placed in geostationary orbit, solar pressure acts as a continuous force upon the balloon. Depending on the solar power collection balloon's position relative to the Earth, the solar pressure either increases or decreases the orbit distance of the balloon. As the orbit distance is reduced and then restored to its original orbit distance due to the effect of solar pressure, the displacement amplitude or the distance from the geostationary orbit to the mean orbit, was determined to be constant at 2.19 meters. Thus for an initially circular orbit, the solar pressure effect is very small.

Power Communication/Transmission

A retro-directive phased array capability is needed for power transmission to the collection beacon. The collection beacon may be a rectifying antenna. A low amplitude microwave beacon is connected to a power reception station. An analog processor resident in each patch antenna receives the beacon radiation at its location, then conjugates its phase, amplifies it and transmits it. The total signal forms a concentrated beam or a retro-directive phase array centered on the location of each beacon. One embodiment uses a high efficiency analog circuit that avoids the sensitivity to cosmic radiation inherent in digital circuitry.

In an alternative embodiment of the invention the retro-directive phased array can be run in an "active mode." In this embodiment, the patch microwave antennas are energized to transmit a broad directivity radiation pattern. The beacon for retro-directive beam transmission in this embodiment can be any radiation such as the radiation return of air vehicles. When a broad directivity radiation patter is applied over a smaller distance, the power density increases. Such a high power density could disable an aircraft if the radiation return of air vehicles is set as the beacon for retro-directive beam transmission.

Feasibility

In order to verify the feasibility of the present invention, various analyses were conducted including A.) an analysis of the effects of solar pressure on a large structure like the solar power collection balloon and B.) a thermal analysis for the solar power collection balloon in an orbital environment.

A.) Solar Pressure Analysis

Understanding the effects of solar pressure on the Solar power collection balloon was analyzed by using classical Newtonian mechanics and the conservation angular momentum to determine the orbital degradation over time. The acceleration due to solar pressure, denoted by $\bar{a}_{sol}$, for the spherical Solar power collection balloon is given by:

$$\bar{a}_{sol} = -\frac{\pi D_A^2}{4M} \frac{\Phi_0}{c} \left(\frac{a}{r}\right)^2 \left[1 + \frac{4}{9}(1-\delta)\beta_{ref}\right]\hat{p}$$

Using Equation (18.b) for the mass and setting $r_0 \cong a_0$, we get:

$$M = \text{Power star mass} = \pi D_A^2 w \rho_{skin}$$

$$\bar{a}_{sol} = -\alpha_0 \hat{p}$$

$$\alpha_0 = \frac{\Phi_0}{4cw\rho_{skin}}\left[1 + \frac{4}{9}(1-\delta)\beta_{ref}\right].$$

Figure 7:
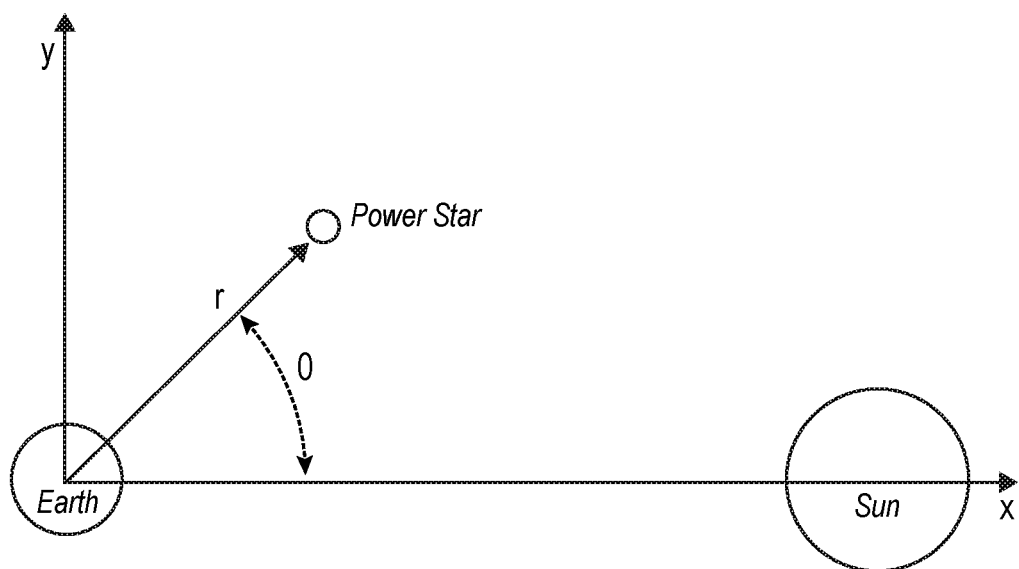
FIG. 7 is a polar coordinate diagram of the relationship between the present invention, the Earth and the Sun.

Since the Solar power collection balloon semi-major axis in its Earth orbit is much smaller than an AU, the unit vector, $\hat{p}$, is approximately along the line from the center of the Earth to the Sun. Let the x-axis be aligned with this vector, and the x-axis together with the y-axis defines the orbit plane. Introduce polar coordinates (r, θ), where θ is the angle from the Earth-Sun line as shown in FIG. 7. Also, neglect the rotation of this reference frame.

With these assumptions, the dynamical equations reduce to two: the energy integral and the expression for the rate of change of angular momentum due to the solar pressure:

$$\dot{r}^2 + r^2\dot{\theta}^2 - \frac{2\mu}{r} + 2\alpha_0 r\cos\theta = 2E$$

$$r\ddot{\theta} + 2\dot{r}\dot{\theta} = \alpha_0 \sin\theta$$

Where E is the total initial energy. In general the solution is periodic. For the Solar power collection balloon we can assume that the nominal motion when the solar pressure is neglected is a circular orbit at orbit radius denoted by $r_0$, and that initially, $r=r_0$, $\dot{r}=0$, and $\theta=0$ with $\dot{\theta}>0$. Then the leading terms in a Fourier series expansion are:

$$r = r_0\left(1 + \frac{1}{8}\Gamma^2(\cos(2mt) - 1) + O(\Gamma^3)\right)$$

$$\theta = mt - \Gamma\sin(mt) + O(\Gamma^2)$$

$$m = \text{Mean motion in a circular orbit} = \sqrt{\mu/r_0^3}$$

$$\Gamma = \frac{\alpha_0}{r_0 m^2} = \frac{r_0^2 \Phi_0}{4\mu c w \rho_{skin}}\left[1 + \frac{4}{9}(1-\delta)\beta_{ref}\right]$$

Using the above expressions, the variation of orbit radius due to solar pressure. The Solar power collection balloon is initially placed in a geostationary orbit, and the solar pressure acts as a continuous force on the solar power collection balloon. Furthermore, depending on the Solar power collection balloon's position relative to Earth, the solar pressure either increases or decreases the Solar power collection balloon's orbit distance. This variation is seen in FIG. 4.8 as the orbit distance is reduced and then restored to its original orbit distance due to effect of solar pressure. The displacement amplitude, or the distance from geostationary orbit to the mean orbit, due to solar pressure was determined to be constant at 2.19 meters. Thus for an initially circular orbit, the solar pressure effect is very small.

B.) Thermal Analysis

The following gives the development of the governing equations for the thermal analysis performed.

First we list the thermal inputs by power distribution region (per unit area):

Section 4.): 0

Section 2.): First note that the solar cell efficiency is, by definition:

$$\eta_s = \frac{\text{power output}}{\text{total solar power in}}$$

Where, $$\text{total solar power in} = \frac{1}{\alpha_s}(\text{total solar power absorbed}).$$

Therefore, $$\eta_s = \alpha_s \frac{\text{power output}}{\text{solar power absorbed}}$$

The power dissipated equals the power absorbed minus the power output $$\frac{\text{power dissipated}}{\text{sol. power absorbed}} = 1 - \eta_s/\alpha_s$$

Figure 8:
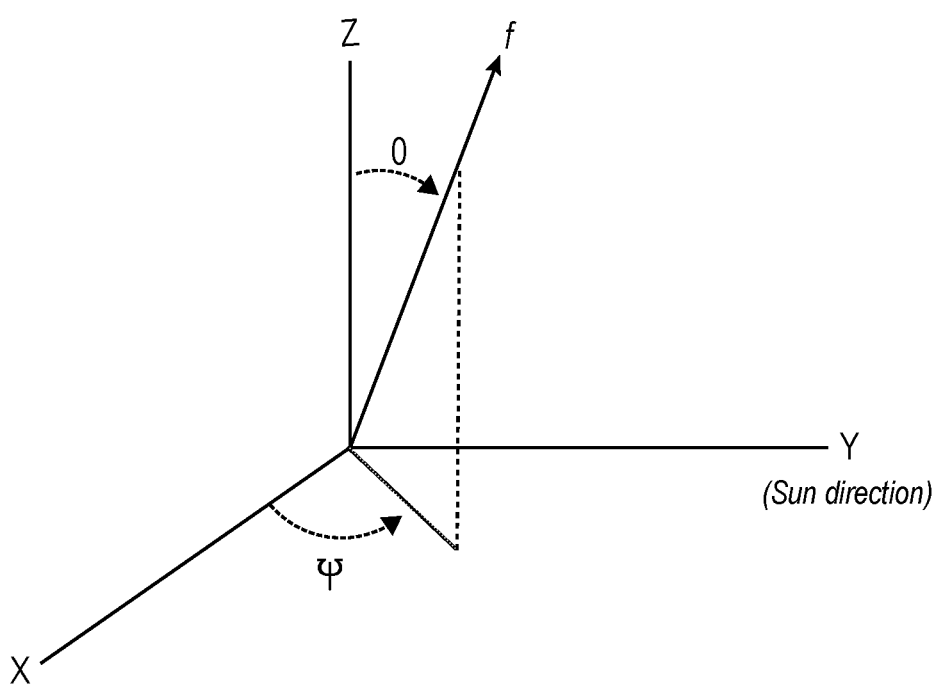
FIG. 8 is a diagram of a local coordinate system on the surface of a solar power collection system of the present invention.

Also:

sol. power absorbed = $\alpha_s Q_s \cos\theta_s$ $$\text{power diss. by solar cells/unit area} = \left(1 - \frac{\eta_s}{\alpha_s}\right)\alpha_s Q_s \cos\theta_s$$

where θs is the angle between the sun direction and the local normal to the surface.

power diss. by the proximate internal transceivers=
$(1-\eta_{Ti})\eta_s \alpha_s Q_s \cos\theta_s$ Section 1.):

$$\text{power diss. by solar cells/unit area} = \left(1 - \frac{\eta_s}{\alpha_s}\right)\alpha_s Q_s \cos\theta_s$$

power diss. by the proximate external transceivers=
$(1-\eta_{Te})\eta_s \alpha_s Q_s \cos\theta_s$ Section 3.):

power diss. by internal transceivers=$(1-\eta_{Ti})$
$\eta_{Ti}\eta_s \alpha_s Q_s \cos\theta_s$ power diss. by the proximate external transceivers=
$(1-\eta_{Te})\eta_{Ti}\eta_{Ti}\eta_s \alpha_s Q_s \cos\theta_s$ FIG. 8 is a diagram of the local polar coordinate system on the surface of the solar power collector balloon of an embodiment of the present invention.

To find the totals, calculate areas:

For Section 2.):

$$r'' = \sin\theta\cos\psi\hat{x} + \sin\theta\sin\psi\hat{y} + \cos\theta\hat{z}$$

$$\cos\theta_s = \hat{r} \cdot \hat{y}$$

$$\sin\theta\sin\psi$$

$$\int_{S,B} ds\cos\theta_s = 2\int_0^{\pi/2} R_A d\theta \int_0^{\varphi} R_A \sin\theta d\psi \cdot \sin\theta\sin\psi$$

$$= 2R_A^2 \int_0^{\pi/2} d\theta \sin^2\theta \int_0^{\varphi} d\psi \sin\psi$$

$$= \frac{\pi}{2}R_A^2(1 - \cos\varphi)$$

For Section 3.), the result is the same as 2.), except different limits on the $\psi$ integral:

$$\int_{S,B} ds \cos\theta_s = 2\int_0^{\pi/2} R_A d\theta \int_\varphi^\pi R_A \sin\theta d\psi \cdot \sin\theta \sin\psi$$

$$= 2R_A^2 \int_0^{\pi/2} d\theta \sin^2\theta \int_\varphi^\pi d\psi \sin\psi$$

$$= \frac{\pi}{2} R_A^2 [-\cos\psi]_\varphi^\pi$$

$$= \frac{\pi}{2} R_A^2 (1 - \cos\varphi)$$

Making substitutions the total power dissipated, is:

$$\left(\left(1 - \frac{\eta_s}{\alpha_s}\right)\alpha_s Q_s + (1 - \eta_{Ti})\eta_s \alpha_s Q_s\right)\frac{\pi}{2} R_A^2 (1 - \cos\varphi) +$$

$$\left(\left(1 - \frac{\eta_s}{\alpha_s}\right)\alpha_s Q_s + (1 - \eta_{Te})\eta_s \alpha_s Q_s\right)\frac{\pi}{2} R_A^2 (1 + \cos\varphi) +$$

$$\left((1 - \eta_{Ti})\eta_{Ti}\eta_s \alpha_s Q_s + (1 - \eta_{Te})\eta_{Ti}^2 \eta_s \alpha_s Q_s\right)\frac{\pi}{2} R_A^2 (1 - \cos\varphi)$$

Consolidating terms, we have:

$$\alpha_s Q_s \frac{\pi}{2} R_A^2$$

$$\left\{2\left(1 - \frac{\eta_s}{\alpha_s}\right) + (1 - \eta_{Ti})\eta_s (1 - \cos\varphi) + (1 - \eta_{Ti})\eta_s (1 - \cos\varphi) + (1 - \eta_{Te}) \right.$$

$$\left.\eta_s (1 + \cos\varphi) + (1 - \eta_{Ti})\eta_{Ti}\eta_s (1 - \cos\varphi) + (1 - \eta_{Te})\eta_{Ti}^2 \eta_s\right)(1 - \cos\varphi)\right\}$$

Assuming the temperature is approximately uniform over the surface of the sphere, the power emitted is $\varepsilon_s \sigma T^4 \cdot 4\pi R_s^2$. Equating this the above equation and solving for the equilibrium temperature, we obtain:

$$T = \left\{\frac{\alpha_s Q_s}{8 E_s \sigma}\right\}^{1/4} \left\{2\left(1 - \frac{\eta_s}{\alpha_s}\right) + (1 - \eta_{Ti})\eta_s (1 - \cos\varphi) + (1 - \eta_{Te})\eta_s (1 + \cos\varphi) + \right.$$

$$\left.(1 - \eta_{Ti})\eta_{Ti}\eta_s (1 - \cos\varphi) + (1 - \eta_{Te})\eta_{Ti}^2 \eta_s (1 - \cos\varphi)\right\}^{1/4}$$

Even when both antenna and solar cell efficiency are very low the average temperature remains within acceptable bounds for survival and operation.

Alternative Applications

Solar Power Generation on Earth

The solar-microwave fabric may be used to generate electricity for powering an average office building located in an urban setting or an industrial park. The average office building in the United States has a total floor space of approximately 15,000 square feet and it uses 17.3 kiloWatt Hours of electricity per year. This means an average power consumption of 29.6 kiloWatts. Let us take this as the power requirement for a single building. In this embodiment, the rectenna beacon may be disposed on the building roof or in an adjacent parking lot. Therefore, the size of the rectenna beacon is of particular importance because of the space allotted to it. The rectenna beacon size must be the diameter of the central transmission signal from the solar power collection balloon. Calculations based on a 100 meter solar power collection balloon with the assumption of using the lowest wavelength in the microwave range, the solar power collection balloon would project an approximately 3.5 kilometer signal on the ground. Given the size of the signal, this embodiment is most ideal for large industrial parks or commercial complexes.

Defense Mechanism in Remote Locations

This embodiment of the present invention further includes internal transceivers with the addition of an "active" mode of power transmission whereby microwave radiation is broadcast to a non-cooperative target and the return from the target is used as the beacon for direction of a high power density beam.

In this embodiment, a compactly folded rug or several rugs of solar-microwave fabric is brought to a forward military base or similarly difficult to access location and is then unfolded, and spread over the ground. The rugs do not need to be flat. Once deployed, it provides solar power using the printed photovoltaic cells and a conventional power management and distribution system.

Besides providing power, this embodiment can be run in "active" retro-directive mode to provide self-defense against airborne attack. The microwave patch antennas are energized to transmit a broad directivity radiation pattern, and radiation return from intruding air vehicles is used as the beacon signal for retro-directive beam transmission. Note that a first revenue unit solar power collection balloon at geostationary orbit will generate safe, low energy density radiation on the ground. When that transmission energy is decreased to less than 100 km, however, the power density is enormous. A rug of solar-microwave fabric could easily be designed to disable an aircraft or rocket at some tens of kilometers distance.

Clearing Orbital Debris

In this application, we use the solar power collection balloon to irradiate low Earth orbit debris such as decommissioned satellites, spent upper stages, etc. in such a way that their orbital velocity is diminished by radiation pressure until they enter the upper atmosphere and are burnt.

A solar power collection balloon would be placed in a somewhat higher orbit such as medium Earth orbit and direct its microwave radiation transmission downward to hit a debris object while the object is approaching the solar power collection balloon. The beam would be turned off when the object starts to recede from the solar power collection balloon as it moves in its lower altitude orbit. When in geostationary orbit, the power density of a feasible solar power collection balloon is quite low. However, over distances less than a thousand kilometers, the power density is very high and radiation pressure can amount to a significant force.

It is assumed here that the debris objects to be de-orbited are large, bus-sized objects, since these are the most likely sources of debris proliferation due to collisions with other objects. The rough goal is to retire at least five such objects per year—which is estimated sufficient to at least stabilize the total number of debris objects in lower Earth orbit.

While the solar power collection balloon is required by the laws of physics (the principal of reverse time) to send a signal directly to its target, there is still the possibility that other satellites could stray into the path and be hit by solar power collection balloon's beam. The width of solar power collection balloon's beam, however, scales from the diameter of solar power collection balloon (as it is essentially a giant aperture) to the spot size at the target. As the beam leaves the phased array, constructive and destructive interference guide it to be distributed over a tight area at the target's location. Any satellite wandering through the beam's path would be moving at velocities at an order of kilometers per second. If by some chance an object passed directly through the beam, it would only do so for a few seconds in an absolute worst case. This would not be enough time for any significant or noticeable drag effects to be delivered to the satellite in question.

In contrast to decaying a target's orbit, the solar power collection balloon would also be able to boost a target's orbit. With slight modification to the targeting scheme proposed above it is possible to boost a target at the expense of the solar power collection balloon's altitude. This occurs where instead of applying force as the target approaches solar power collection balloon, force is now applied when it is leaving the solar power collection balloon. In this embodiment, the object will now engage its beacon once directly below the solar power collection balloon (theta=0 measured from the x axis), and disengage it once over the horizon. This allows the radiation force from the solar power collection balloon to be applied in the prograde direction, rather than the retrograde. Thus adding, rather than sapping, the target's orbital energy.

A target object was simulated for this orbital boost case. A goal altitude of 700 kilometers for the target was set. This boost required 49 days to complete and the solar power collection balloon lost approximately 114 kilometers of altitude due to drag and its own radiation force while conducting this maneuver.

With the simulation of both target boosts and decays using the solar power collection balloon, it can be seen that the solar power collection balloon is capable of manipulating its own orbit while providing a service to a target. With careful planning and target selection, the solar power collection balloon could conduct a combination of orbital boosts and decays upon various targets to perform maintenance on its own orbit. Then, once the solar power collection balloon's purpose is fulfilled or its photovoltaic cells are decayed, it could boost a target's orbit until its own reaches a low altitude, where drag and atmospheric effects will quickly end its life. After conducting two orbit decays and three boosts, the solar power collection balloon reaches an extremely low orbit where aerodynamic forces will quickly dominate it.

While the principles of the invention have been described herein, it is to be understood by those skilled in the art that this description is made only by way of example and not as a limitation as to the scope of the invention. Further embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A space-based solar power communication system, comprising:
   a. an inflatable structure comprising a solar-microwave fabric having an exterior surface layer and an inner surface layer;
   b. a plurality of photovoltaic cells on said solar-microwave fabric's exterior surface layer;
   c. a plurality of microwave transmitters on said solar-microwave fabric's exterior surface layer,
      i. wherein at least one of said plurality of microwave transmitters is electrically connected to at least one of said plurality of photovoltaic cells;
   d. a first transceiver on said solar-microwave fabric's inner surface layer; and
   e. a second transceiver on said solar-microwave fabric's inner surface layer,
      i. wherein said first transceiver is electrically connected to at least one of said plurality of photovoltaic cells, said first transceiver and said second transceiver are configured to beam electrical energy from said first transceiver to said second transceiver, and said second transceiver is electrically connected to at least one of said plurality of microwave transmitters.

2. The space-based power communication system of claim 1, wherein said inflatable structure is spherical.

3. The space-based solar power communication system of claim 1, wherein said plurality of microwave transmitters comprises an optically transparent microwave patch antenna.

4. The space-based solar power communication system of claim 1, wherein said plurality of photovoltaic cells and said plurality of microwave transmitters are printed on said solar-microwave fabric.

5. The space-based solar power communication system of claim 1, further comprising a beacon configured to receive power from the plurality of microwave transmitters.

6. The space-based solar power communication system of claim 5, wherein said beacon further comprises a transmitter and a rectenna.

7. The space-based solar power communication system of claim 1 further comprising a substrate layer disposed between said solar-microwave fabric's exterior surface layer and said solar-microwave fabric's inner surface layer wherein said substrate layer comprises an electrically conductive grid configured to act as an electrical ground.

8. The space-based solar power communication system of claim 1 wherein said first transceiver and said second transceiver are disposed on opposite sides of said inflatable structure's interior surface and said first transceiver and said second transceiver are oriented so that a resonant axis of said first transceiver is parallel to a resonant axis of said second transceiver.

* * * * *